United States Patent
Valten

(10) Patent No.: US 11,057,068 B2
(45) Date of Patent: Jul. 6, 2021

(54) RECEIVER MODULE, DATA TRANSMISSION SYSTEM AND METHOD FOR RECEIVING AN ELECTROMAGNETIC SIGNAL

(71) Applicant: Rohde & Schwarz GmbH & Co. KG, Munich (DE)

(72) Inventor: Thomas Valten, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/881,191

(22) Filed: May 22, 2020

(65) Prior Publication Data

US 2020/0412397 A1 Dec. 31, 2020

(30) Foreign Application Priority Data

Jun. 27, 2019 (EP) .................................... 19183044

(51) Int. Cl.
| | |
|---|---|
| *H04L 27/08* | (2006.01) |
| *H04B 1/12* | (2006.01) |
| *H04B 1/16* | (2006.01) |
| *H03M 1/12* | (2006.01) |

(52) U.S. Cl.
CPC ................. *H04B 1/12* (2013.01); *H04B 1/16* (2013.01); *H03M 1/12* (2013.01)

(58) Field of Classification Search
CPC .............. H04B 1/12; H04B 1/16; H03M 1/12
USPC ....................................................... 375/345
See application file for complete search history.

(56) References Cited

U.S. PATENT DOCUMENTS

| | | | |
|---|---|---|---|
| 6,965,658 B1 | 11/2005 | Lindqvist et al. | |
| 8,971,210 B1* | 3/2015 | Murali | H04W 84/12 370/254 |
| 2003/0103584 A1* | 6/2003 | Bjerke | H04L 25/067 375/340 |
| 2010/0085231 A1 | 4/2010 | Doris | |
| 2010/0104041 A1* | 4/2010 | Ibi | H04L 27/265 375/285 |
| 2014/0177748 A1 | 6/2014 | Malaga et al. | |
| 2014/0359394 A1* | 12/2014 | Gasanov | H03M 13/2957 714/758 |

* cited by examiner

*Primary Examiner* — Don N Vo
(74) *Attorney, Agent, or Firm* — Christensen O'Connor Johnson Kindness PLLC

(57) ABSTRACT

A receiver module for receiving an electromagnetic signal, including an analog frontend and at least a first receiving channel and a second receiving channel is described. The receiving channels are both connected to the analog frontend, wherein the frontend is configured to receive an input signal including a symbol sequence and to forward the input signal to the receiving channels, wherein the receiving channels each include an analog to digital converter, wherein the second receiving channel includes an attenuator, wherein the first receiving channel and the second receiving channel each include a soft-input-soft-output-decoder, and wherein the soft-input-soft-output decoders each are configured to process the symbol sequence. Moreover, a data transmission system and a method for receiving an electromagnetic signal are described.

16 Claims, 2 Drawing Sheets

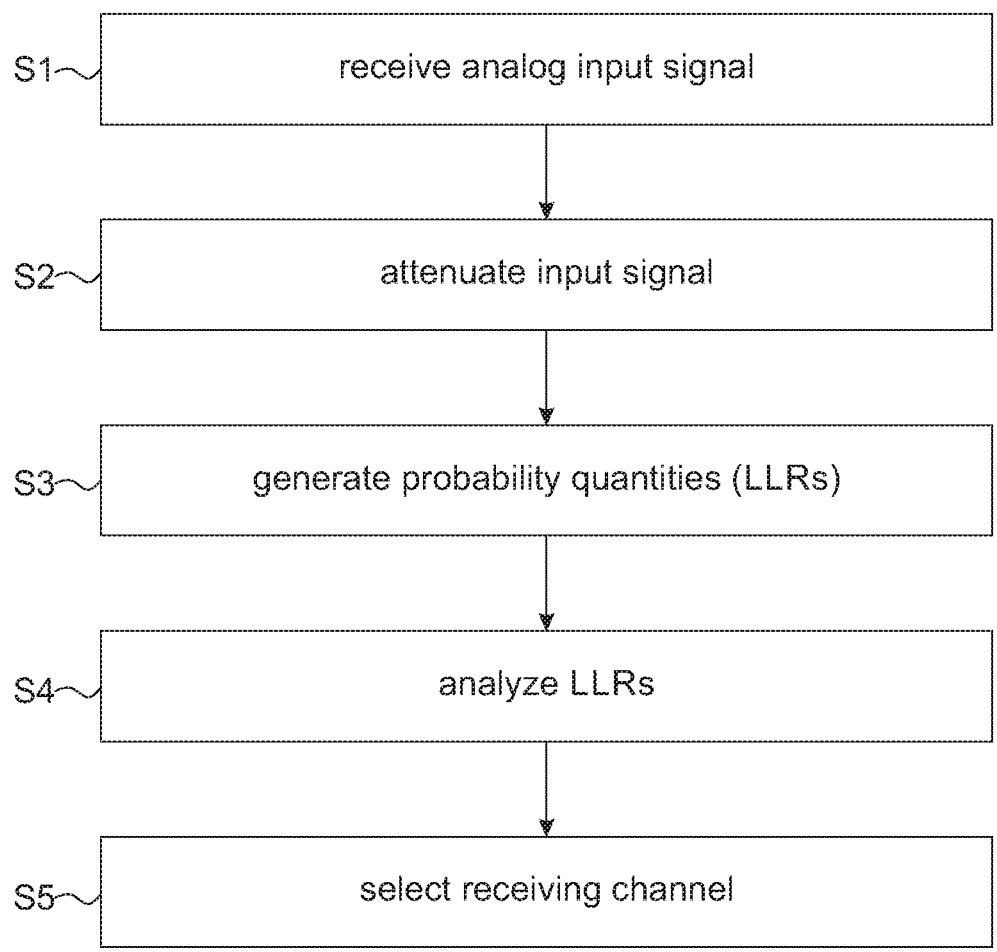

RECEIVER MODULE, DATA TRANSMISSION SYSTEM AND METHOD FOR RECEIVING AN ELECTROMAGNETIC SIGNAL

FIELD OF THE DISCLOSURE

The present disclosure relates to a receiver module for a broadband data transmission system. Further, the present disclosure relates to a data transmission system for a broadband transmission of data as well as to a method for receiving an electromagnetic signal.

BACKGROUND

In receivers for electromagnetic signals, it is known in the art to use an Automatic Gain Control (AGC) to adjust the gain of the analog front end in such a way that signals within a large dynamic range can be sufficiently amplified and demodulated.

Usually, adjustable elements of the AGC are electronically adjustable attenuators and electronically adjustable amplifiers. If high controlling speeds are necessary, this can lead to the envelope curve of the signal also being modified, which in turn can cause disturbances of the received signal.

However, the process of controlling the adjustable elements needs to be as fast as possible for broadband signals.

Recursive AGC algorithms known in the art that are used for the fast control of the adjustable elements can become unstable. This may lead to oscillations of the received signal and thus no useful signal is obtained.

It is therefore the objective to provide a receiver module, a data transmission system and a method for receiving electromagnetic signals that improve the disadvantages present in the art.

SUMMARY

According to the present disclosure, a receiver module for receiving an electromagnetic signal is provided. In an embodiment, the receiver module comprises an analog frontend and at least a first receiving channel and a second receiving channel. The receiving channels are both connected to the analog frontend, wherein the frontend is configured to receive an input signal comprising a symbol sequence and to forward the input signal to the receiving channels. The receiving channels each comprise an analog to digital converter. The second receiving channel comprises an attenuator. The first receiving channel and the second receiving channel each comprise a soft-input-soft-output-decoder, wherein the soft-input-soft-output decoders each are configured to process the symbol sequence.

In the following, the term analog to digital converter will be abbreviated with "ADC".

The soft-input-soft-output decoders ("SISODs" in the following) do not bear the problems described above with respect to the state of the art. On one hand, the SIS ODs do not become unstable even if high controlling speeds are required. On the other hand, all SISODs receive the input signal at the same time. Thus, there is no need to switch between the different SISODs. Accordingly, no disturbances arise from switching between different elements of the receiver module.

According to one aspect, the analog to digital converters each have an operating range with a linear portion. The attenuator is configured to attenuate the input signal such that the linear portions of the operating ranges of the analog to digital converters overlap with each other.

Due to the attenuation by the attenuator, the linear operating range of the ADC in the second receiving channel is located at a higher input power than the linear operating range of the ADC in the first receiving channel, wherein the linear operating ranges of the ADCs overlap with each other. This way, the two ADCs cover a larger range of input power where at least one of the two ADCs is in the linear operating range.

According to another aspect, at least a third receiving channel is provided. The third receiving channel is connected to the analog frontend. The third receiving channel comprises an attenuator being different from the attenuator of the second receiving channel. In an embodiment, the third receiving channel comprises a soft-input-soft-output decoder.

Due to the attenuation by the attenuator, the linear operating range of the ADC in the third receiving channel is located at a higher input power than the linear operating range of the ADC in the second receiving channel, wherein the linear operating ranges of the ADCs in the second and third receiving channels overlap with each other. Thus, there is an even larger range of input power where at least one of the three ADCs is in the linear operating range.

In contrast, the linear operating ranges of the ADC in the first receiving channel and of the ADC in the third receiving channel do not overlap with each other as the linear operating range of the ADC in the third receiving channel may be at a significantly higher input power than the linear operating range of the ADC in the first receiving channel.

The receiver module may also only comprise any number of receiving channels bigger than three. Put differently, the receiver module comprises more than one receiving channel, wherein the input signal is attenuated by an attenuator in all but one receiving channel.

In some embodiments, the receiving channels are synchronized with each other. More precisely, the receiving channels are synchronized with each other such that the SISODs analyze the same portion of the input signal.

According to another aspect, the soft-input-soft-output-decoders each are configured to generate a probability quantity, wherein the probability quantity is indicative of the probability that a received symbol has a certain value. For example, in the case of a binary input signal, the output of the SISODs is not just simply "0" or "1", but rather a quantity that indicates the probability of the value of the bit being "0" or "1".

The probability quantity may be a likelihood ratio, for example a logarithmic likelihood ratio (LLR). Generally speaking, the magnitude of the respective generated LLR is lower the further the input power is outside of the linear operating range of the respective one of the ADCs.

Conversely, the magnitude of the respective generated LLR is higher the nearer the input power is to a center of the linear operating range of the respective one of the ADCs.

According to a further aspect, the receiver module comprises an analysis circuit or module, wherein the analysis module is connected to the soft-input-soft-output-decoders and is configured to analyze the probability quantities. In some embodiments, the analysis module is configured to select one of the receiving channels based on the result of the analysis.

Therein and in the following, the term "select one of the receiving channels" is to be understood to mean that the input signal that is processed in the selected channel is afterwards used for further processing of the input signal. In other words, it is the input signal processed in the selected receiving channel that is forwarded to further processing components and/or to a memory by the receiver module.

In a further embodiment, the analysis module is configured to compare the probability quantities generated by the soft-input-soft-output decoders and to select one of the receiving channels based on the result of the comparison. Thus, the analysis module compares the values of the generated probability quantities and selects one of the receiving channels based on the comparison of the values of the probability quantities.

Depending on the definition of the probability quantities, the receiving channel is selected that has the highest value or the lowest value of the probability quantity. As the probability quantities are indicative of which of the ADCs currently has the highest probability to be in the linear operating range, the receiving channel having the highest probability to be in the linear operating range is selected.

In the case of the probability quantities being LLRs, the analysis module may be configured to select the receiving channel having the LLR with the highest magnitude.

According to another aspect, the analysis module is configured to determine a frequency of the input signal and/or a frequency of a disturbing signal that is received via the analog frontend. The analysis module may comprise a polyphase FFT filter bank, wherein the polyphase FFT filter bank is configured to determine the frequency of the input signal and/or the frequency of the disturbing signal.

The disturbing signal may have a considerably higher input power than the input signal, such that processing the input signal is hindered or even prevented. However, as the linear operating ranges of the receiving channels, for example of the ADCs, are different from each other, the disturbing signal can be processed in the linear operating range of one of the receiving channels, for example in the linear operating range of one of the ADCs. Thus, a measurement of the frequency of the disturbing signal can be done by the analysis module.

According to a further aspect, the analog frontend comprises a filter unit, wherein the filter unit is configured to filter out the disturbance signal based on the frequency of the disturbance signal determined by the analysis module. For example, the filter unit is established as a notch-filter.

In other words, the filter unit can be tuned to the specific frequency of the disturbing signal, which specific frequency is determined by the analysis module. This way, the disturbing signal is filtered out and the input signal can be processed without disturbance from the disturbing signal.

The present disclosure further provides a data transmission system for a broadband transmission of data. In an embodiment, the system comprises the receiver module described above. Regarding the advantages of the data transmission system, reference is made to the explanations given above with regard to the receiver module.

The present disclosure also provides a method for receiving an electromagnetic signal. In an embodiment, the method comprises the following steps:

receiving an input signal via a frontend, wherein the input signal comprises a symbol sequence;

forwarding the input signal at least to a first receiving channel and to a second receiving channel;

attenuating the input signal in at least one of the receiving channels, thereby generating an attenuated input signal;

processing the input signal and/or the attenuated input signal via a soft-input-soft-output-decoder in every receiving channel, thereby generating a probability quantity for each receiving channel, wherein the probability quantity is indicative of the probability that a received symbol has a certain value; and selecting one of the receiving channels based on the probability quantities.

The SISODs do not bear the problems described above with respect to the state of the art. On one hand, the SISODs do not become unstable even if high controlling speeds are required. On the other hand, all SISODs receive the input signal at the same time. Thus, there is no need to switch between the different SISODs. Accordingly, no disturbances arise from switching between different elements of the receiver module.

Depending on the definition of the probability quantities, the receiving channel may be selected that has the highest or the lowest value of the probability quantity.

The probability quantity may be a likelihood ratio, for example a logarithmic likelihood ratio. Accordingly, the receiving channel having the likelihood ration LLR with the highest magnitude may be selected.

In some embodiments, the input signal and the attenuated input signal are digitized via analog to digital converters in the receiving channels. Generally speaking, the magnitude of the respective generated LLR is lower the further the input power is outside of the linear operating range of the respective one of the ADCs. Conversely, the magnitude of the respective generated LLR is higher the nearer the input power is to a center of the linear operating range of the respective one of the ADCs. Thus, the receiving channel having the LLR with the highest magnitude may be selected.

According to another aspect, the input signal is attenuated such that linear portions of the operating ranges of the analog to digital converters overlap with each other. Due to the attenuation, the linear operating range of one of the ADCs is located at a higher input power than the linear operating range of the other one of the ADCs, wherein the linear operating ranges of the ADCs overlap with each other. This way, the two ADCs cover a larger range of input power where at least one of the two ADCs is in the linear operating range.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 3 schematically shows a flow chart of a method for receiving an electromagnetic signal according to an embodiment of the present disclosure.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
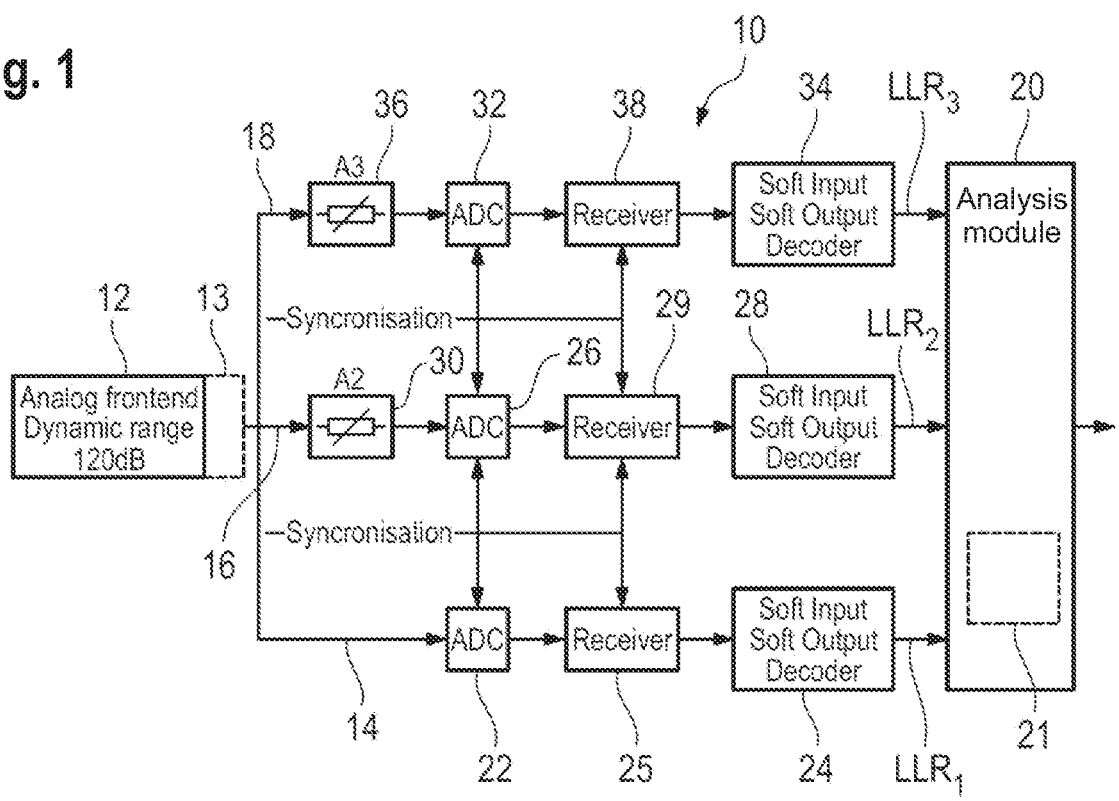
FIG. 1 schematically shows a receiver module for receiving an electromagnetic signal according to an embodiment of the present disclosure.

FIG. 1 shows a block diagram of a receiver module 10 for receiving an electromagnetic signal. The receiver module 10 may be part of a data transmission system, for example of a broadband data transmission system. For instance, the receiver module 10 relates to a radio transmission system. In some embodiments, the receiver module includes a number of circuits or circuit elements.

In the embodiment shown, the receiver module 10 comprises an analog frontend 12 with an optional filter unit 13, a first receiving channel 14, a second receiving channel 16, a third receiving channel 18 and an analysis circuit or module 20. In some embodiments, The filter unit 13 may be established as a notch-filter that can be tuned to different frequencies. In other words, the filter unit 13 is configured to filter out signals having a specific frequency, wherein the specific frequency can be adjusted.

The receiver module 10 may also only comprise two receiving channels or any number of receiving channels bigger than three. Generally, the receiver module 10 comprises more than one receiving channel.

In the following, an exemplary embodiment of the receiver module 10 with three receiving channels 14, 16, 18 is explained. The explanations given below apply mutatis mutandis to any other number of receiving channels bigger than one.

The receiving channels 14, 16, 18 are connected to the analog frontend 12 downstream of the analog frontend 12 in a signal transmitting manner. The analysis module 20 is connected to the receiving channels 14, 16, 18 downstream of the receiving channels 14, 16, 18 in a signal transmitting manner Optionally, the analysis module 20 comprises a polyphase FFT filter bank 21 that is configured to determine a frequency of a signal received by the analysis module 20.

The first receiving channel 14 comprises a first analog to digital converter 22 ("ADC" in the following) being directly connected to the analog frontend 12. Further, the first receiving channel 14 comprises a first soft-input-soft-output-decoder 24 ("SISOD" in the following) downstream of the first ADC 22. A first receiver circuit or unit 25 is interconnected between the first ADC 22 and the first SISOD 24 and is configured to receive and process the input signal.

The second receiving channel 16 comprises a second ADC 26 and a second SISOD 28, wherein the second receiving channel 16 is built up similar to the first receiving channel 14. Thus, a second receiver circuit or unit 29 is interconnected between the second ADC 26 and the second SISOD 28.

The second receiving channel 16 differs from the first receiving channel 14 in that the second receiving channel 16 comprises a second attenuator 30 between the analog frontend 12 and the second ADC 26. Therein, the name "second attenuator" is chosen such that the number of the attenuator matches the number of the receiving channel. This nomenclature does not necessarily imply that there is a first attenuator. Put differently, the second attenuator 30 is the attenuator 30 assigned to the second receiving channel 16.

The third receiving channel 18 comprises a third ADC 32, a third SISOD 34 and a third attenuator 36, wherein the third receiving channel 18 is laid out similar to the second receiving channel 16. A third receiver circuit or unit 38 is interconnected between the third ADC 32 and the third SISOD 34. Put differently, the third attenuator 36 is the attenuator 36 assigned to the third receiving channel 18.

The ADCs 22, 26, 32 each have an operating range with respect to input power that comprises a linear portion. Usually, when receiving an electromagnetic signal the respective receiver or rather the respective ADC shall be operated such that the ADC is operating in the linear portion of its operating range.

Figure 2:
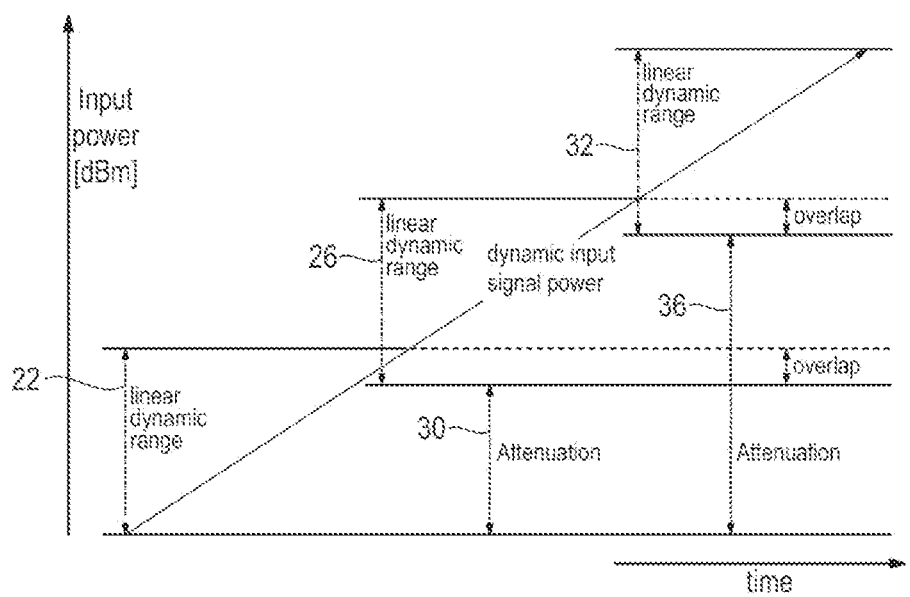
FIG. 2 shows a diagram of input power plotted against time.

As shown in FIG. 2, the attenuators 30, 36 each are configured to attenuate the input signal in a specific way, namely such that the linear operating ranges ("linear dynamic range" in FIG. 2) of the ADCs 22, 26, 32 overlap when the input signal is applied to the receiving channels 14, 16, 18.

In some embodiments, the second attenuator 30 attenuates the input signal less than the third attenuator 36.

Due to the attenuation by the second attenuator 30, the linear operating range of the second ADC 26 is located at a higher input power than the linear operating range of the first ADC 22, wherein the linear operating ranges of the first ADC 22 and of the second ADC 26 overlap.

Due to the attenuation by the third attenuator 36, the linear operating range of the third ADC 32 is located at a higher input power than the linear operating range of the second ADC 26, wherein the linear operating ranges of the second ADC 26 and of the third ADC 32 overlap.

In contrast, the linear operating ranges of the first ADC 22 and of the third ADC 32 do not overlap as the linear operating range of the third ADC 32 is significantly higher than the linear operating range of the first ADC 22. Thus, there is a large range of input power where at least one of the three ADCs 22, 26, 32 is in the linear operating range.

The receiver module 10 is configured to perform a method for receiving an electromagnetic signal that is explained in the following with reference to FIG. 3. As shown in FIG. 3, an analog input signal is received via the analog frontend 12 and forwarded to all of the receiving channels 14, 16, 18 (step S1). The input signal may comprise a symbol sequence that corresponds to a message and/or to data to be received.

In the first receiving channel 14, the input signal is directly forwarded to the first ADC 22. In the second receiving channel 16 and in the third receiving channel 18, the input signal is attenuated by the second attenuator 30 and by the third attenuator 36, respectively. Thus, an attenuated input signal is generated in the second receiving channel 16 and in the third receiving channel 18 (step S2).

The input signal and the attenuated input signal is then digitized by the first ADC 22, and by the second ADC 26 and the third ADC 32, respectively. The digitized input signals are then received and/or processed by the respective receiver units 25, 29, 38.

From the receiver units 25, 29, 38, the received and/or processed digitized input signals are forwarded to the respective SISODs 24, 28, 34.

In some embodiments, the receiver units 25, 29, 38 are synchronized with each other such that the same portion of the symbol sequence of the input signal is forwarded to the respective SISODs 24, 28, 34.

Each of the SISODs 24, 28, 34 processes the respective digitized input signal and generates a probability quantity for the respective one of the receiving channels 14, 16, 18 (step S3). Therein, the SISODs 24, 28, 34 may employ soft input soft output coding, e.g. at least one of turbo codes and LDPC codes, in order to generate the probability quantity.

The probability quantity is indicative of the probability that a received symbol comprised in the digitized input signal has a certain value. For example, if the symbol sequence comprised in the input signal is a binary one, the probability quantity is indicative of the probability that the respective received symbol has the value "0" or the value "1". Of course, the symbols comprised in the input signal do not need to be binary. The input signal may, e.g., also be PAM-n coded or may be coded in any other suitable way.

The generated probability quantity is established as a likelihood ratio, for example as a logarithmic likelihood ratio ("LLR" in the following).

As a result of step S3, a LLR is generated for each of the receiving channels 14, 16, 18. The LLRs for the first receiving channel 14, the second receiving channel 16 and the third receiving channel 18 are denoted by $LLR_1$, $LLR_2$ and $LLR_3$ in FIG. 1, respectively.

Generally speaking, the magnitude of the respective generated LLR is lower the further the input power is outside of the linear operating range of the respective one of the ADCs 22, 26, 32. Conversely, the magnitude of the respective generated LLR is higher the nearer the input power is to a center of the linear operating range of the respective one of the ADCs 22, 26, 32.

The LLRs are forwarded to the analysis module 20 and analysed by the analysis module (step S4). Finally, one of the receiving channels 14, 16, 18 is selected based on the analysis of the probability quantities (step S5).

Generally speaking, the one of the receiving channels 14, 16, 18 is selected that has the highest LLR. The LLRs are indicative of which of the ADCs 22, 26, 32 currently has the highest probability to be in the linear operating range. Thus, the one of the receiving channels 14, 16, 18 having the highest probability to be in the linear operating range is selected in step S5.

If a disturbing signal is present, for example a disturbing signal having a considerably higher input power, also called input level, than the input signal, processing the input signal in the way described above may be hindered or even prevented. However, as the linear operating ranges of the receiving channels 14, 16, 18, more precisely the linear operating ranges of the ADCs 22, 26, 32, are different from each other, the disturbing signal can be processed in the linear operating range of one of the receiving channels 14, 16, 18, more precisely in the linear operating range of one of the ADCs 22, 26, 32. Then, a frequency of the disturbing signal is determined by the analysis module 20, for example by the polyphase FFT filter bank 21.

Afterwards, the disturbing signal is filtered out by the filter unit 13 by tuning the filter unit 13 to the specific frequency of the disturbing signal, which specific frequency is determined by the analysis module 20. Thus, after filtering out the disturbing signal the input signal can be processed without disturbance from the disturbing signal.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term information can be used interchangeably with the term signal, as generally understood in the art.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A receiver for receiving an electromagnetic signal, comprising an analog frontend and at least a first receiving channel and a second receiving channel, wherein the first and second receiving channels are both connected to the analog frontend, the frontend configured to receive an input signal comprising a symbol sequence and to forward the input signal to the receiving channels, the first and second receiving channels each comprise an analog to digital converter, wherein the second receiving channel comprises an attenuator, the first receiving channel and the second receiving channel each comprise a soft-input-soft-output-decoder, the soft-input-soft-output decoders each configured to process the symbol sequence and configured to generate a probability quantity, wherein the probability quantity is indicative of the probability that a received symbol has a certain value, wherein the receiver further comprises an analysis circuit connected to the soft-input-soft-output-decoders, the analysis circuit configured to analyze the probability quantities, configured to compare the probability quantities generated by the soft-input-soft-output decoders, and configured to select one of the receiving channels based on the result of the comparison.

2. The receiver according to claim 1, wherein the analog to digital converters each have an operating range with a linear portion, and wherein the attenuator is configured to attenuate the input signal such that the linear portions of the operating ranges of the analog to digital converters overlap with each other.

3. The receiver according to claim 1, wherein at least a third receiving channel is provided, wherein the third receiving channel is connected to the analog frontend, wherein the third receiving channel comprises an attenuator being different from the attenuator of the second receiving channel, and wherein the third receiving channel comprises a soft-input-soft-output decoder.

4. The receiver according to claim 1, wherein the receiving channels are synchronized with each other.

5. The receiver according to claim 1, wherein the probability quantity is a likelihood ratio.

6. The receiver according to claim 1, wherein the probability quantity is a logarithmic likelihood ratio.

7. The receiver according to claim 1, wherein the analysis circuit is configured to determine at least one of a frequency of the input signal and a frequency of a disturbing signal that is received via the analog frontend.

8. The receiver according to claim 7, wherein the analog frontend comprises a filter unit, wherein the filter unit is configured to filter out the disturbance signal based on the frequency of the disturbance signal determined by the analysis circuit.

9. The receiver according to claim 8, wherein the filter unit is established as a notch-filter.

10. The receiver according to claim 1, wherein the analysis circuit comprises a polyphase FFT filter bank, wherein the polyphase FFT filter bank is configured to determine at least one of the frequency of the input signal and the frequency of the disturbing signal.

11. A data transmission system for a broadband transmission of data, comprising the receiver according to claim 1.

12. A method for receiving an electromagnetic signal, comprising:
    receiving an input signal via a frontend, wherein the input signal comprises a symbol sequence;
    forwarding the input signal at least to a first receiving channel and to a second receiving channel;
    attenuating the input signal in at least one of the first or second receiving channels, thereby generating an attenuated input signal;
    processing at least one of the input signal or the attenuated input signal via a soft-input-soft-output-decoder in every receiving channel, thereby generating a probability quantity for each receiving channel, wherein the probability quantity is indicative of the probability that a received symbol has a certain value; and
    selecting one of the first and second receiving channels based on the probability quantities.

13. The method of claim 12, wherein the probability quantity is a likelihood ratio.

14. The method of claim 12, wherein the probability quantity is a logarithmic likelihood ratio.

15. The method of claim 12, wherein the input signal and the attenuated input signal are digitized via analog to digital converters in the receiving channels.

16. The method of claim 15, wherein the input signal is attenuated such that linear portions of the operating ranges of the analog to digital converters overlap with each other.

* * * * *